United States Patent
Monferrer et al.

(10) Patent No.: US 7,865,751 B2
(45) Date of Patent: Jan. 4, 2011

(54) MICROARCHITECTURE CONTROLLER FOR THIN-FILM THERMOELECTRIC COOLING

(75) Inventors: Pedro Chaparro Monferrer, Barcelona (ES); José González, Terrassa (ES)

(73) Assignee: Intel Corporation, Santa Clara, CA (US)

( * ) Notice: Subject to any disclaimer, the term of this patent is extended or adjusted under 35 U.S.C. 154(b) by 813 days.

(21) Appl. No.: 11/764,412

(22) Filed: Jun. 18, 2007

(65) Prior Publication Data
US 2008/0310099 A1    Dec. 18, 2008

(51) Int. Cl.
G06F 1/20    (2006.01)
G06F 1/32    (2006.01)

(52) U.S. Cl. .................. 713/322; 713/300; 713/320
(58) Field of Classification Search .......... 713/300–324
See application file for complete search history.

(56) References Cited

U.S. PATENT DOCUMENTS 7,574,321 B2 *  8/2009  Kernahan et al. ........... 702/179
2003/0122245 A1 *  7/2003  Chu et al. ................... 257/706
2005/0213301 A1 *  9/2005  Prasher ....................... 361/688
2007/0056621 A1 *  3/2007  Baskaran .................... 136/201

OTHER PUBLICATIONS

J. Donald and M. Martonosi "Techniques for Multicore Thermal Management: Classification and New Exploration". ISCA2006.
R. S. Prasher, J.-Y. Chang, I. Sauciuc, S. Narasimhan, D. Chau, G. Chrysler, A. Myers, S. Prstic, and C. Hu, "Nano and Micro Technology-Based Next-Generation Package-Level Cooling Solutions," Intel Technology Journal, vol. 9, No. 4, Nov. 2005.

* cited by examiner

Primary Examiner—Dennis M Butler
(74) Attorney, Agent, or Firm—Trop, Pruner & Hu, P.C.

(57) ABSTRACT

A device having multiple cores executes an algorithm to control Thin-Film Thermoelectric Coolers (TFTEC) that employ the Peltier effect to remove heat from the various cores of the multi-core processor. The algorithms may combine Thread Migration (TM) and Dynamic Voltage/Frequency Scaling (DVFS) to provide Dynamic Thermal Management (DTM) and TFTEC control.

27 Claims, 4 Drawing Sheets

MICROARCHITECTURE CONTROLLER FOR THIN-FILM THERMOELECTRIC COOLING

Multi-core, powerful microprocessors run applications that satisfy developments in a number of different digital technologies. The multi-core microprocessor generates a significant amount of heat when processing data, requiring that the semiconductor die be cooled for reliable operation. Most of the heat is generated at a circuit side of the semiconductor die, but existing cooling techniques are mostly limited to the removal of heat through a back side of the semiconductor die. Heat sinks mounted to the back side of the die remove some heat, but thermal resistance between the circuit side and the back side reduce the effectiveness of cooling. Therefore, additional improvements are needed to effectively remove heat from multi-core microprocessors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
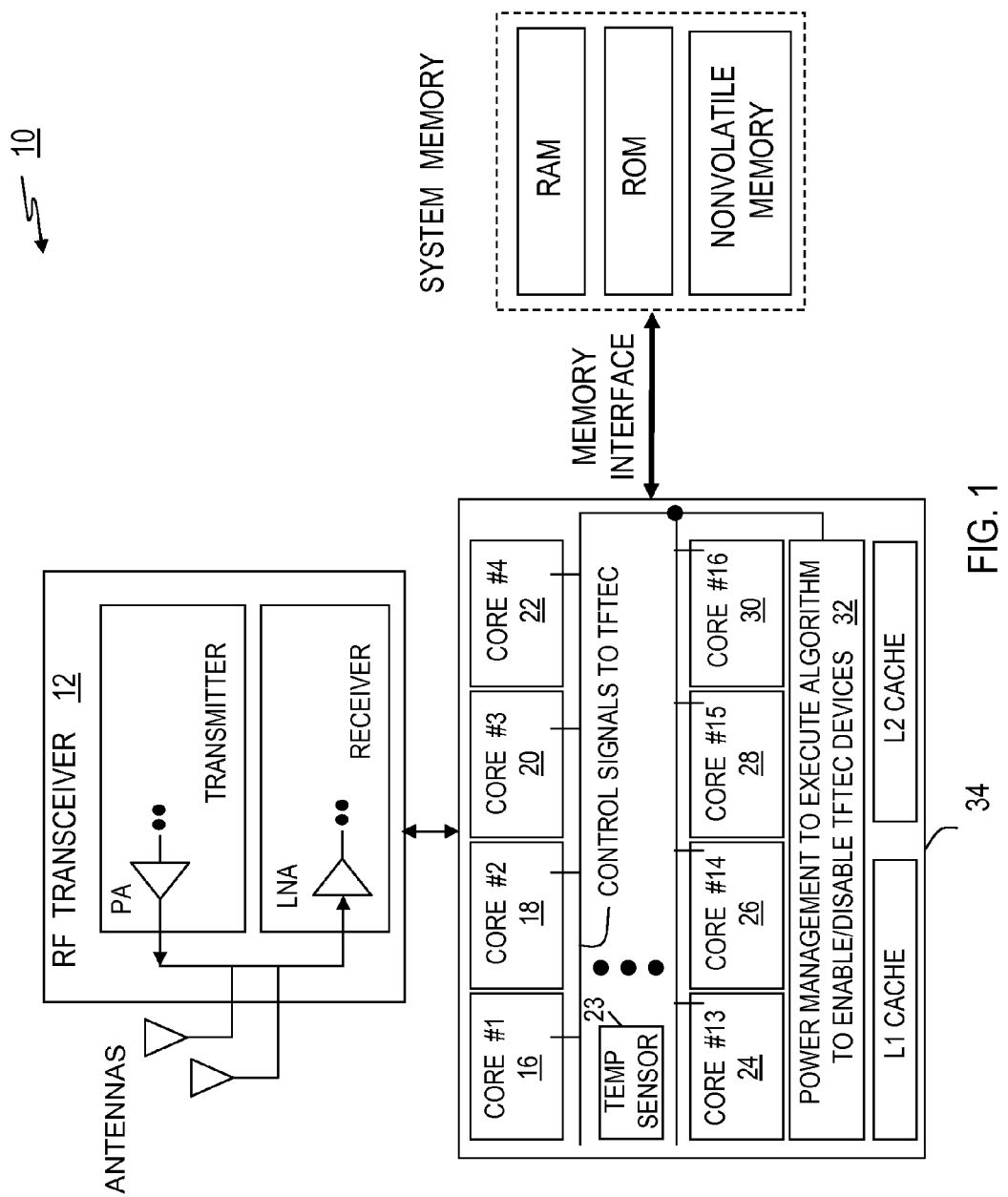
FIG. 1 is a diagram that illustrates an embodiment of a wireless device having multiple cores that executes an algorithm to control Thin-Film Thermoelectric Coolers (TFTEC) that employ the Peltier effect to remove heat from the processor in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The present invention may be used in a multi-core or a single core processor that executes an algorithm to control Thin-Film Thermoelectric Coolers (TFTEC) that employ the Peltier effect. With heat removed from the processor, higher resolution displays, better image capturing, and more processing capability may be implemented to provide higher performance applications for multi-tasking processors. As such, the present invention may be used in a variety of products with the claimed subject matter incorporated into wireless products as well as desktop computers, laptops, smart phones, MP3 players, cameras, communicators and Personal Digital Assistants (PDAs), medical or biotech equipment, automotive safety and protective equipment, automotive infotainment products, etc. However, it should be understood that the scope of the present invention is not limited to these examples.

FIG. 1 is a simplistic embodiment of a multi-core processor 34 that executes a control algorithm to control the TFTEC devices. The embodiment presented in the figure illustrates a wireless device 10 having antenna(s) coupled to transceivers to accommodate modulation/demodulation. The embodiment allows for multiple radio subsystems collocated in the same platform of communications device 10 to provide the capability of communicating in an RF/location space with other devices. The analog front end transceiver 12 is connected to a multi-core processor 34. Multi-core processor 34 may execute baseband and process application functions and allow processing workloads to be shared across the embedded processor cores. Accordingly, the architecture of multi-core processor 34 includes a number of cores "N" illustrated by core 16, core 18, core 20, core 22 ... core 24, core 26, core 28, and core 30 in wireless device 10. It should be noted that the number of cores embedded on a semiconductor die in multi-core processor 34 does not limit the present invention or limit the claimed subject matter.

The TFTEC devices are Peltier devices embedded to remove heat from multi-core processor 34 that may be formed using vias formed with a P-type metal or semiconductor material in combination with vias formed with an N-type metal or semiconductor material (not shown). The vias with different semiconductor materials define a thermoelectric couple in which current flows from one via to the other via. The vias filled with different types of material act as a Peltier cooling device in that they transport heat produced at a circuit side of the semiconductor chip into the substrate for dissipation through the substrate. Thus, each pair of vias having different materials in combination with a semiconductor die form a Peltier cooling device.

The TFTEC devices that employ the Peltier effect remove heat by "carrying" the heat with a supplied electrical current. Peltier devices, also referred to as "thermoelectric modules", are small solid-state devices that function as heat pumps. The thin-film implementation of the TEC device may be included under an Integrated Heat Spreader (IHS) in a Thermal Interface Material (TIM) that "glues" the semiconductor die with the IHS. The TFTEC device's active on-die cooling rate from heat removal may be dynamically modified based on an amplitude of the current supplied to the device. The DC current applied to the TFTEC moves heat from one side of the device to the other where it may be removed using a heat sink. The "cold" side of the TFTEC may be used to cool multi-core microprocessor 34.

Should the DC current applied to the TFTEC become too high, the power that the IHS must remove may limit the performance of the TFTEC. In accordance with the present invention, the microarchitecture controls the DC current supplied to the TFTECs that is implemented with each of the cores. The microarchitecture is represented by the interconnections of the registers, buses, functional blocks, execution units, pipelining, cache memory, and the peripheral support. The control algorithm executed by the microarchitecture for a multi-core design dynamically changes the DC current to the TFTEC so that the heat at a "hot spot" within the core may be removed by the TFTEC without heating the IHS to the point of limiting the TFTEC performance.

The high energy dissipation from multi-core architectures and tera-scale architectures necessitate thermal management mechanisms in order to extract peak performance from the cores. A power management block 32 receives data points from on-die thermal sensors 23 that may be read by the microarchitecture. Information gathered from sensors 23 directs the control algorithm, at predetermined time intervals such as the reconfiguration interval, to enable or disable any particular TFTEC in the platform. Alternatively, the TFTECs may be enabled or disabled when particular events occur such as, for example, the time at which a threshold temperature is exceeded. Power management block 32 also may receive data points that indicate core activity, power and performance requirements for use by the algorithm in administering power changes through a power delivery network to the multiple cores in multi-core processor 34. Thus, the algorithm may combine Thread Migration (TM) and/or Dynamic Voltage/ Frequency Scaling (DVFS), among other thermal management techniques, to provide a holistic approach to Dynamic Thermal Management (DTM) and TFTEC control.

Figure 2:
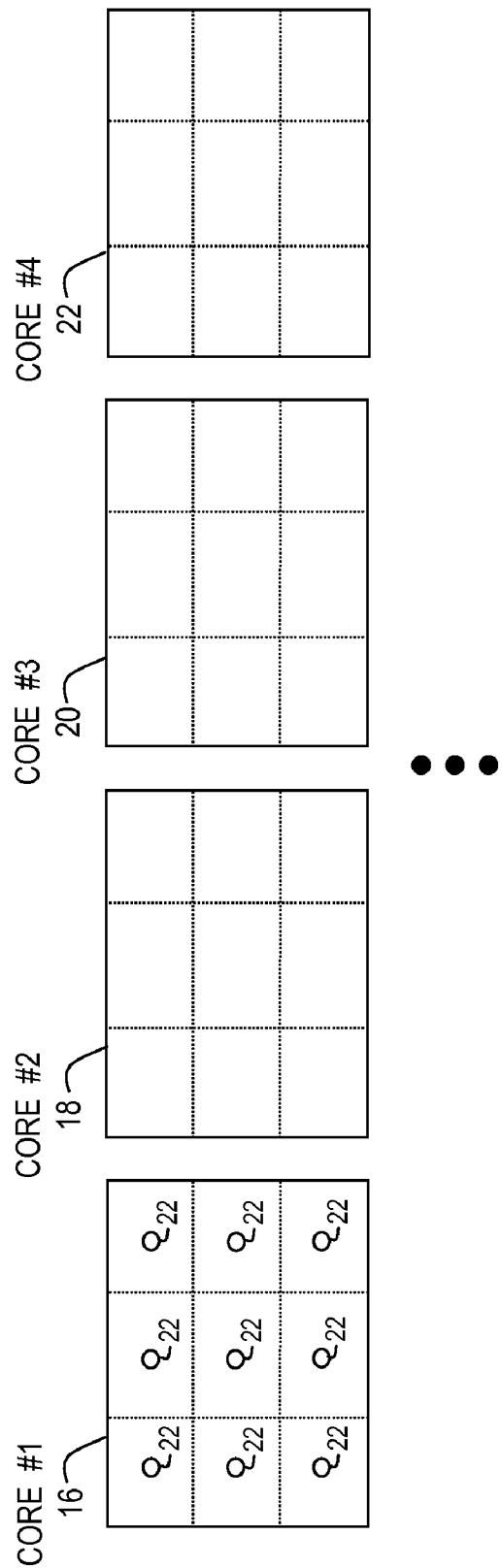
FIG. 2 is a diagram that illustrates TFTEC placement for a multi-core processor in accordance with one embodiment of the present invention.

FIG. 2 illustrates one embodiment of a multi-core system implementing a plurality of TFTECs 22 on top of each core that may be divided, for example, into a grid of 3×3 cells. Although the figure illustrates nine TFTECs to cover the cells defined by the grid, it should be noted that the present invention is not so limited in this respect and other numbers of TFTECs arranged on top of the embedded core are envisioned. A first level of TIM and a TFTEC may be placed on top of each cell so that each TFTEC provides cell area coverage. On-die thermal sensors, performance and/or power meters may be read by the microarchitecture to provide power management block 32 with input data points for the voltage and frequency of each core, the migration of threads, and cell temperatures. Thus, the thermal management control algorithms may combine thread migration, Dynamic Voltage and Frequency Scaling (DVFS) and TFTEC control to enhance the performance of each core in the multi-core system.

Different types of control are envisioned for the TFTECs. In one embodiment, the control algorithm may enable all of the TFTECs 22 available in the multi-core processor system all the time, referred to as "All-On". Thus, the power management algorithm may coordinate an output decision common to all cores and supplies all the TFTECs with a constant current. Alternatively, the control algorithm may provide independent decisions specific to each core, where the TFTECs within that core are all enabled as a group. Thus, the algorithm executing from the microarchitecture may address the specific power requirements of each core and enable or disable the TFTECs for each core separate from other cores on the platform.

In another embodiment, the control algorithm may provide on-demand triggers and independent usage of the TFTECs. In this embodiment the TFTECs are individually enabled ("on") or disabled ("off") and the current supplied to control the TFTECs may be supplied as a discrete constant DC value or as an analog value that may be dynamically varied between a value of zero and a maximum value. The analog controller may be implemented by a PID controller, fuzzy logic controller or another control algorithm. The microarchitecture controlling the algorithm receives data points that allow power management block 32 to provide thermal management for each of the various cores and provide control to individually manage the various TFTEC devices allocated to each core.

A thermal sensor may be incorporated to report on a specific TFTEC and indicate to power management block 32 that the temperature exceeds a threshold, i.e., a predetermined temperature limit. Power management block 32 provides a fixed current to the TFTEC that enables the device, a condition referred to as a "Toggle controller". The equivalent power supplied to the TFTEC may be set to 0.6 Watt, for example, and the intensity of the electrical current supplied to the TFTEC may be changed dependent upon how close the temperature is to the target temperature. Note that the input power is directly related to the input current so that setting either one determines the value for the other.

In yet another embodiment the control algorithm may use a TFTEC equation that models the behavior of a TFTEC, a condition referred to as a "compute controller". By way of example, given a target temperature reduction and a power load, the equation may be resolved to provide the power required by the TFTEC. The control algorithm may enable any TFTEC in the platform and compute its input current, and therefore, provide rule based thermal management to TFTEC to provide significant speedup over the best known DTM schemes.

These embodiments allow a control algorithm to receive temperature values sensed by thermal sensors for specific TFTECs, and in addition, the algorithm receives power measurements that may be used in some embodiments. Note that the temperature of a particular location not only depends on its own power dissipation and on the temperature of the IHS, but also on the temperature of the surrounding area. In a "neighbor controller" not only is a TFTEC turned on, but the surrounding TFTECs are turned on as well to further reduce the temperature of the hotspot. The surrounding TFTECs may be supplied with a lower input current to minimize their power dissipated towards the IHS. In accordance with the present invention, the thermal management scheme can supply TFTECs located on hot spots with a predefined current when the temperature exceeds a threshold. By grouping several TFTECs, one TFTEC cools the hot spot and the surrounding TFTECs cool the lateral heat dissipating from the hot spot. By the coordinated actions of different TFTECs the hot spot may be cooled.

In some embodiments the power delivery network to implement control for separate TFTECs for each core in a multi-core processor system may not be feasible. To minimize the number of independent current supplies routed to the TFTEC devices and to reduce the number of TFTECs located on top of the die, different power management solutions may be applied. For instance, one embodiment may insert a TFTEC on top of each core over an area that has a high likelihood of becoming a hot spot such as, for example, a process intensive floating point unit. In another embodiment, TFTECs may be inserted on top of some cores but not on other cores, then thread migration may be used to move hot threads to those cores having the TFTECs. In yet another embodiment, several TFTECs may be grouped under the same power delivery network to provide DC current to a TFTEC to cool the hot spot and a similar DC current to surrounding TFTECs to cool the substrate that receives heat from lateral heat dissipation. A single controller can handle different TFTECs that all receive the same control current.

For a multi-core processor system, policies may be enforced to drive to a lower complexity for controlling TFTECs that may include grouping the TFTECs located in each core. In other words, all TFTECs on top of the same core are joined such that if a TFTEC in a core is turned on, then all TFTECs that are located above that core are turned on. For the example where the multi-core processor includes sixteen cores, sixteen controllers and sixteen current supply lines would accommodate the cores. The controllers may be implemented in a discrete (Toggle) or continuous way for instance, with a PID controller, and the policies Toggle-Group and PID-Group are obtained.

Further, a baseline microarchitecture may include a dynamic thermal management algorithm that utilizes slow-down mechanisms, DVFS and thread migration. The slow-down mechanisms may include a "Stop & Go" state that is triggered when the sensed temperature for a core is near an emergency threshold such as 80° C. for example. Upon entering the "Stop & Go" state the context is saved and the overheated core may be switched to sleep mode to allow time for a core temperature reduction. Thus, dynamic thermal management techniques may be combined with a TFTEC to provide a safety margin to keep the core substrate below a temperature limit.

One property of TFTECs is that when less heat is flowing from the die to the TFTEC, a lower input current achieves a desired temperature reduction. Thus, a lower power dissipated by the core implies that a smaller energy is needed to reduce the temperature, resulting in a higher TFTEC efficiency. This may be exploited to create a proactive temperature reduction controller, where the policy may be referred to as "Low". In the "Low" state the TFTECs located at the cores with low-power threads are enabled, producing a reduced core temperature using the higher TFTEC efficiency. Then, power hungry threads located in a different core may be moved to this pre-cooled core. By moving the threads to the cooler core, a longer core heat-up time can be accommodated once the hot thread arrives at the core.

Additional controllers may include modifications to the DVFS controllers and/or the TM controllers to include TFTEC-related information. For instance, the "Enhanced Toggle" controller disables the TFTECs when a low-power thread is migrated to a hot core. This allows the power consumption from the TFTECs to be saved since the core location is likely to cool down even without the TFTEC being enabled.

Another controller includes a combination between TFTEC and TM that is referred to as the "TFTEC-Aware Thread Migration" (F.TM). It is a variation of Toggle+P.TM (a thread migration scheme that sends high power threads to cooler cores) in which a hot thread may be sent to several possible cold cores. In P.TM the highest-power thread is always sent to the coldest core, however, in F.TM that thread can be sent to one of several cores whose temperatures are in a range of 0.5° C., for example. Among this group of cores, the core having the higher number of TFTECs is selected to receive the thread.

The "Overspeed-DVFS" controller is a Global-DVFS controller that uses TFTEC information to increase the voltage and frequency supplied to a core when the core's TFTECs have been enabled. Instead of the DVFS' PID controller receiving the current core's temperature, in Overspeed-DVFS the PID receives a temperature reflecting the cooling attributed to the TFTECs in the last time interval and the expected influence for the next time interval. In particular, the PID for core "i" at time "t" uses the temperature:

$$T_{core-i} = T_{sensor-i} - \text{DeltaTEC}_i(t) + \text{DeltaTEC}_i(t+1).$$

In general, there is a limit in the power consumption of processors, often referred to as TDP (Thermal Design Power). The maximum energy that can be employed in TFTECs is the difference between the TDP (maximum energy consumption per interval) and the multi-core processor's power consumption. However, employing all of this energy in the TFTECs may not be practical because the extra energy consumption can heat the IHS and/or the area of the chip not covered by TFTECs.

The "All-TDP" controller turns on all TFTECs with the same maximum input current that meets TDP requirements. The PID-Group-TDP controller is a version of PID-Group in which the energy driven to the TFTECs is scaled down, if necessary, to meet TDP constraints. Similarly, the PID-TDP controller is a version of PID in which the energy driven to the TFTECs is scaled in the same way.

The thread migration may be implemented as a power-based thread migration scheme (P.TM) where the threads with the highest power are assigned to the cores with the lower temperatures. A thermal-based thread migration policy (T.TM) allows the threads in the cores operating at the lower temperatures to be swapped with the threads in the cores operating at the higher temperatures.

Figure 3:
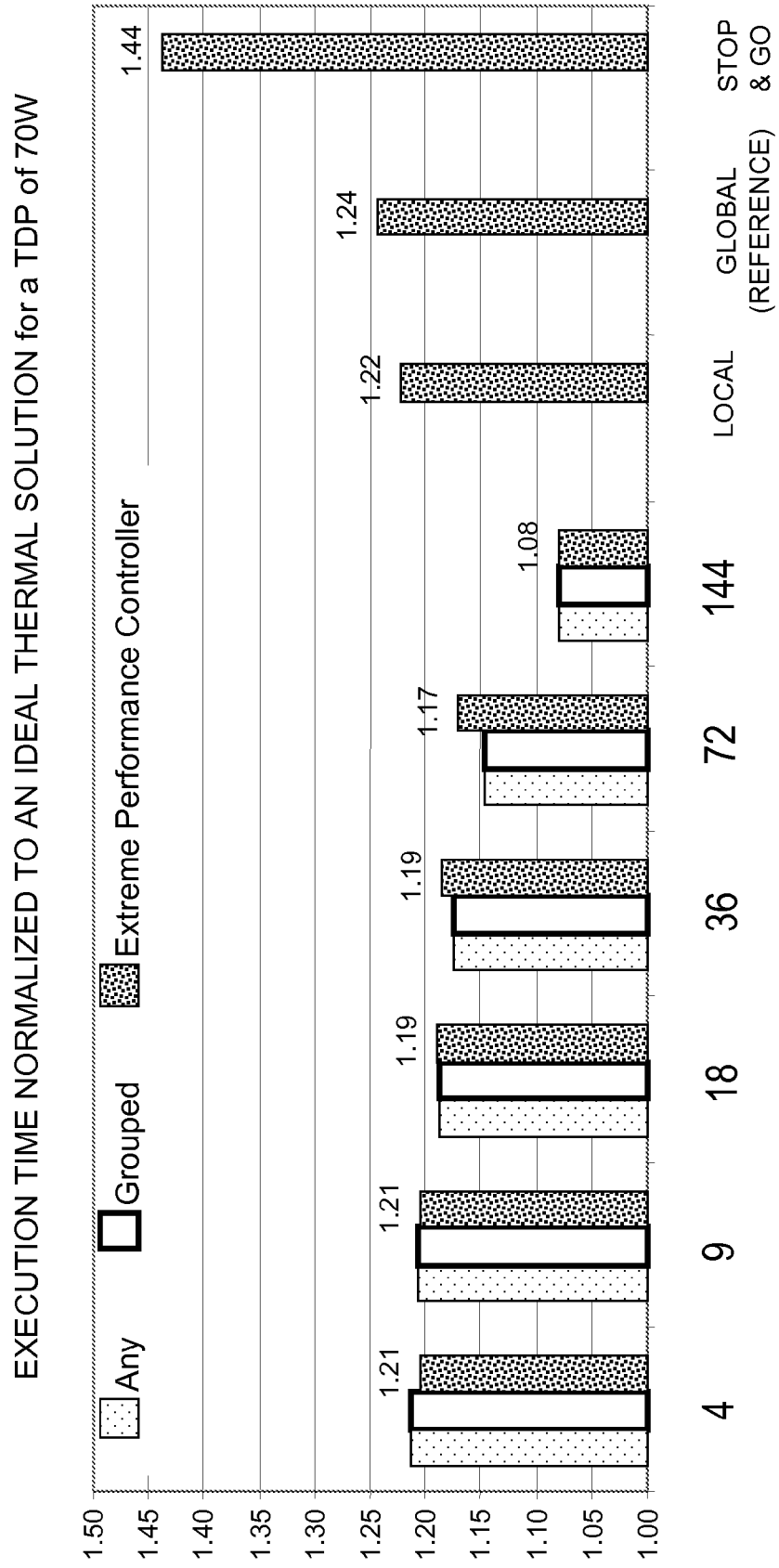
FIG. 3 is a diagram that illustrates performance for a number of TFTECs with different combinations of TFTEC+ Thread Migration (TM)+Global-DVFS (Dynamic Voltage and Frequency Scaling) that are normalized to a thermally unlimited design.

FIG. 3 is a diagram that illustrates performance for a number of TFTECs with different combinations of TFTEC+TM+Global-DVFS that are normalized to a thermally unlimited design, e.g., an ideal thermal solution with no thermal emergencies. The dynamic thermal management schemes are presented for any TFTEC having an independent input ("Any") and for grouped TFTECs ("Grouped"). In addition, the performance results where there is no TDP constraint is shown for comparison purposes. Per-Core DVFS, Global-DVFS and Stop & Go are also shown. It can be seen that even for a small number of TFTECs the performance is improved compared to classical DTM (Per-Core DVFS, Global-DVFS and Stop & Go). The higher the number of TFTECs placed with the core, the higher the performance. In addition, grouping the TFTECs does not pose a significant hurdle in performance. Limiting the TDP to 70 W (reasonable for the applications used in the evaluation) is not a limitation either. In the best case the performance is improved from a normalized execution time of 1.22 (Per-Core DVFS+TM) to 1.08 (Global-DVFS+TM+TFTEC).

FIG. 3 illustrates that TFTEC provides a significant performance boost in all the analyzed combinations of TM and DVFS. It is clear that controllers employing TFTEC combined with some thread migration policies achieve performance improvements compared even to more complex controller solutions without TFTEC. Among the combinations employing TFTEC devices, high performance is achieved using per core DVFS.

Figure 4:
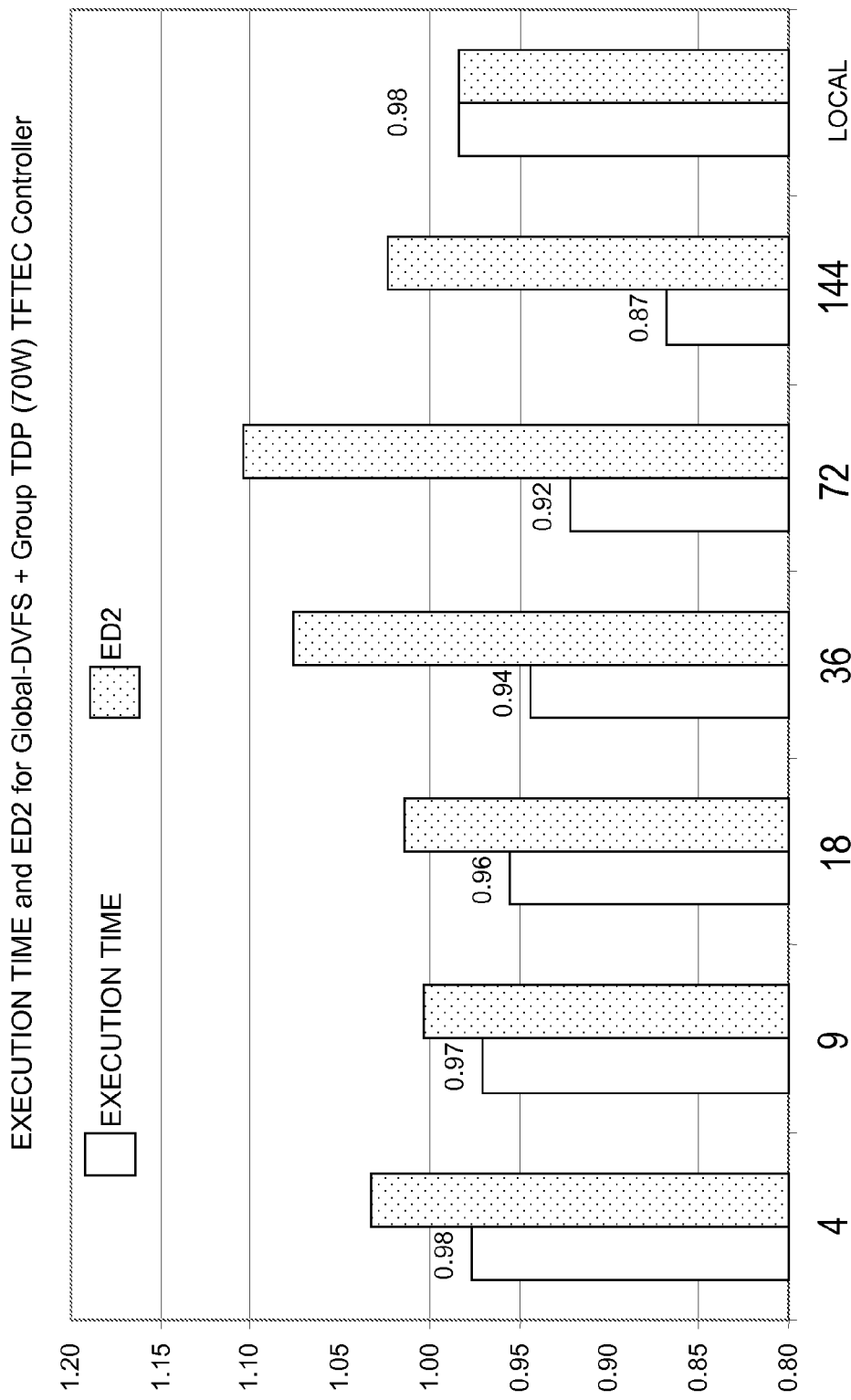
FIG. 4 is a diagram that illustrates performance for a number of TFTECs with different combinations of TFTEC+TM+ Global-DVFS that are normalized to a Global-DVFS.

FIG. 4 is a diagram that illustrates energy and performance for a number of TFTEC controllers normalized to a Global-DVFS. The figure shows that the increase in Energy-Delay$^2$ Product is relatively small. Again, the limitation of 70 W TDP is enforced.

Control algorithms designed ad hoc for combined DVFS, TM and TFTEC may be devised. For example, the energy dissipated by an enabled TFTEC towards the heat spreader may be reduced by limiting the input current. Since this limits the performance of the TFTEC, per core DVFS can be triggered to further reduce the temperature of the hot spot. The parameters of the control algorithm provide the TFTEC input current and the new voltage and frequency operating values for the processor operation. Thus, this control algorithm includes different parameters compared to others that control DVFS and TFTEC independently.

By now it should be apparent that embodiments of the present invention allow a control algorithm to combine Thread Migration (TM) with Dynamic Voltage/Frequency Scaling (DVFS) in order to provide a holistic approach to Dynamic Thermal Management (DTM) and TFTEC control. The algorithm controls the DC current supplied to the TFTEC to dynamically vary the amount of cooling performed by that device. In accordance with the present invention, the TFTEC placed in the TIM is controlled from the microarchitecture.

Numerous embodiments provide for the placement of the TFTECs on top of the core to remove heat from hot spots and improve performance of the cores in the multi-core processor.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A processor, comprising:
a power management block to run an algorithm to combine Thread Migration (TM), Dynamic Voltage and Frequency Scaling (DVFS), and Dynamic Thermal Management (DTM) with control of Thin-Film Thermoelectric Coolers (TFTECs).

2. The processor of claim 1 wherein all of the TFTECs available in the processor are to be enabled all the time.

3. The processor of claim 1 wherein the power management block is to provide individual control to manage each of a plurality of the TFTEC devices allocated to a core.

4. The processor of claim 1 wherein a current supplied to control the TFTECs is a constant DC value.

5. The processor of claim 4 wherein the current supplied to control the TFTECs is to dynamically vary between a value of zero and a predetermined value.

6. The processor of claim 5 wherein the value of the current supplied to the TFTECs is to be changed dependent upon how close a sensed temperature is to a target temperature.

7. The processor of claim 5 wherein the current supplied to the TFTECs is an analog current provided by a PID controller, fuzzy logic or a theoretic controller.

8. The processor of claim 1 wherein the processor is a multi-core processor.

9. The processor of claim 8 wherein a constant current is to be commonly supplied to all the TFTECs in all cores of the multi-core processor.

10. The processor of claim 8 wherein thermal requirements specific to a core either enable or disable the TFTECs as a group associated with the core separate from other cores.

11. The processor of claim 1 further comprising:
a power delivery network to provide DC current to a first TFTEC to cool a hot spot and a similar DC current to TFTECs surrounding the hot spot to facilitate lateral heat dissipation.

12. The processor of claim 1 further comprising:
a power delivery network to provide DC current to a first TFTEC to cool a hot spot and surrounding TFTECs are to be supplied with a lower current to minimize their power dissipated towards an Integrated Heat Spreader (IHS).

13. The processor of claim 1 wherein the algorithm includes a slow-down mechanism triggered when a sensed temperature for a core is near a threshold value.

14. The processor of claim 13 wherein the slow-down mechanism is to switch a core to sleep mode to allow time for temperature reduction of the core.

15. The processor of claim 1 wherein a plurality of the TFTECs located at cores with low temperatures are to be enabled to further reduce core temperature to realize a pre-cooled core and power hungry threads are to be located to the pre-cooled core.

16. The processor of claim 1 wherein the TFTECs are to be disabled when a low-power thread is migrated to a hot core.

17. The processor of claim 1 wherein a hot thread is to be sent to a core having a higher number of TFTECs as selected from several cores whose sensed core temperatures are within a temperature range.

18. The processor of claim 1 wherein TFTEC related information is used to increase the voltage and frequency supplied to a core having the TFTECs enabled.

19. The processor of claim 18 wherein a PID controller is to receive a core's temperature reflecting cooling attributed to the TFTECs in a last time interval and an expected influence for a next time interval.

20. The processor of claim 1 wherein when all TFTECs are enabled, energy provided to the TFTECs is scaled to meet Thermal Design Power (TDP) constraints.

21. A multi-core processor, comprising:
a power management block to address power requirements of each core in the multi-core processor and enable or disable Thin-Film Thermoelectric Coolers (TFTECs) placed on each core separate from other cores in the multi-core processor via a combination of Thread Migration (TM), Dynamic Voltage and Frequency Scaling (DVFS), and Dynamic Thermal Management (DTM).

22. The multi-core processor of claim 21 where a second core does not have Thin-Film Thermoelectric Coolers (TFTECs) and the thread migration is to move hot threads from the second core to the first core having the TFTECs.

23. A multi-core processor, comprising:
a first power delivery network to provide current to a plurality of Thin-Film Thermoelectric Coolers (TFTECs) located on top of a first core;
a second power delivery network to provide current to a plurality of TFTECs located on top of a second core; and
a power management block to run an algorithm to combine Thread Migration (TM), Dynamic Voltage and Frequency Scaling (DVFS), and Dynamic Thermal Management (DTM) to control the plurality of TFTECs.

24. The multi-core processor of claim 23, wherein TFTEC related information is used to increase voltage and frequency to a core having TFTECs enabled.

25. A multi-core processor having a power management block, comprising:
Thin-Film Thermoelectric Coolers (TFTECs) that employ the Peltier effect to remove heat from cores of the multi-core processor; and
controllers to provide Dynamic Thermal Management (DTM) to the multi-core processor that include a first controller to control Dynamic Voltage and Frequency Scaling (DVFS), a second controller to control Thread Migration (TM), and a third controller to provide TFTEC control, where an algorithm executed by the power management block is to combine data points to manage the first, second and third controllers.

26. The multi-core processor of claim 25, wherein the third controller is an analog PID controller or a fuzzy logic controller.

27. The multi-core processor of claim 25, wherein the data points allow the power management block to provide thermal management for each core and manage TFTEC devices allocated to each core.

* * * * *